United States Patent [19]

Stokes et al.

[11] Patent Number: 5,283,458
[45] Date of Patent: Feb. 1, 1994

[54] TEMPERATURE STABLE SEMICONDUCTOR BULK ACOUSTIC RESONATOR

[75] Inventors: Robert B. Stokes, Torrance; Kei-fung Lau, Harbor City; James Chung-Kei Lau, Torrance, all of Calif.

[73] Assignee: TRW Inc., Redondo Beach, Calif.

[21] Appl. No.: 859,768

[22] Filed: Mar. 30, 1992

[51] Int. Cl.$^5$ .......................................... H01L 29/66
[52] U.S. Cl. .................................. 257/416; 257/419; 257/467; 310/324
[58] Field of Search ............... 257/415, 416, 419, 468, 257/469, 470, 467; 310/324, 343; 333/155

[56] References Cited

U.S. PATENT DOCUMENTS

| 4,556,812 | 12/1985 | Kline et al. | 310/324 |
| 4,719,383 | 1/1988 | Wang et al. | 310/324 |
| 5,023,503 | 6/1991 | Legge et al. | 333/188 |

FOREIGN PATENT DOCUMENTS

| 59-23613 | 2/1984 | Japan | 310/324 |
| 60-145715 | 8/1985 | Japan | 310/324 |

OTHER PUBLICATIONS

Cushman, D. et al., "SBAR Filter Monolithically Integrated with HBT Amplifier", Proceedings 1990 IEEE Ultrasonics Symposium, pp. 1-6, 1990.

Wang, J. S. et al., "Low Temperature Coefficient Shear Wave Thin Films For Composite Resonators and Filters", IEEE Ultrasonic Symposium, 1983, pp. 3-6.

Primary Examiner—William Mintel
Assistant Examiner—Minhloan Tran
Attorney, Agent, or Firm—Ronald L. Taylor

[57] ABSTRACT

This invention discloses a semiconductor bulk acoustic resonator including at least one thin film piezoelectric layer positioned on a semiconductor substrate. The acoustic resonator includes a heating ring positioned around the outer perimeter of the piezoelectric layer in order to heat the piezoelectric layer to a desirable elevated temperature. A heat sensing film fabricated on the piezoelectric layer monitors the temperature of the piezoelectric layer such that the heating ring maintains the piezoelectric layer at a constant temperature. By this, an oscillator circuit using this semiconductor bulk acoustic resonator as the frequency controlling element can maintain a constant frequency over a wide range of temperatures which may affect frequency stability.

13 Claims, 1 Drawing Sheet

TEMPERATURE STABLE SEMICONDUCTOR BULK ACOUSTIC RESONATOR

BACKGROUND OF THE INVENTION

1. Field of the Invention

This invention relates generally to a semiconductor bulk acoustic resonator, and more particularly, to a temperature stable semiconductor bulk acoustic resonator incorporating a heating element and a temperature sensor.

2. Discussion of the Related Art

Semiconductor bulk acoustic resonators (SBAR), known in the art, are generally thin film acoustic resonators fabricated on a semiconductor wafer. Typically, the SBAR will include one or more thin layers, or films, of a piezoelectric material, such as zinc oxide or aluminum nitride, with conducting thin film electrode layers above and below the piezoelectric layers. The thin film piezoelectric layers are formed, typically by a sputtering process, on a suitable substrate. The layered structure has an acoustical resonance for acoustic waves traveling perpendicular to the layers, and this resonance appears as an electrical resonance between the electrode layers. SBARs can be configured in a variety of ways, including one-port resonators similar to conventional bulk crystal resonators, and also two-port bandpass filters. For a review of at least one fabrication process to produce such a resonating device, see Cushman, D. et al., "SBAR Filter Monolithically Integrated with HBT Amplifier," Proceedings 1990 IEEE Ultrasonics Symposium, herein incorporated by reference.

One of the advantages of an SBAR is realized from the result that they are fabricated on a semiconductor wafer, and thus, can be integrated into semiconductor circuits, such as oscillators, filter-amplifiers, receivers, etc. Some of these applications, such as oscillators, require very high center frequency stability of the resonating acoustical signal over a wide temperature range. As is known, variances in temperature will generally cause a particular piezoelectric material under a constant driving current to resonate at varying frequencies. Practical frequency stability may require a −20 ppm frequency tolerance over a temperature range from −50° C. to +70° C. Aluminum nitride films, as are presently used in the art, have at best about a 26 ppm/deg. C. temperature sensitivity, and thus are not effective for many of these applications.

In order to maintain an SBAR at a very rigid operating frequency over a wide temperature range, it is known to place the entire chip or resonator assembly in an oven being maintained at a constant elevated temperature. By maintaining the oven at a constant temperature above the maximum ambient temperature expected, the temperature of the resonator is kept constant regardless of the ambient temperature. Therefore, the resonant frequency of the SBAR is stable over changes in ambient temperature. However, these ovens suffer the drawbacks of being exceedingly large, and as a result they consume large amounts of power. Consequently, these drawbacks limit the applicability of highly stable SBARs.

One method of producing an SBAR which is temperature stable in frequency has been proposed in the article by Wang, J.S. et al., "Low Temperature Coefficient Shear wave Thin Films for Composite Resonators and Filters," IEEE Ultrasonic Symposium, 1983. In that article it is proposed to utilize a composite of ZnO/Si or AlN/Si to produce a resonator having a low temperature coefficient. More particularly, shear waves are generated by either a ZnO or a AlN film having their Z-axis oriented from normal to produce quasi-shear waves in these films and pure shear waves in a silicon membrane substrate. This material approach to temperature stabilization is believed to be impractical because of the requirements for extreme accuracy in the film thicknesses and quality.

What is needed then is an SBAR which operates at a very stable frequency over a wide range of ambient temperatures without requiring the SBAR to be placed in a heating oven or requiring impractical piezoelectric film tolerances. It is therefore an object of the present invention to provide such an SBAR.

SUMMARY OF THE INVENTION

This invention discloses an SBAR fabricated on an appropriate substrate. The SBAR includes one or more layers of a piezoelectric film positioned across an airgap recess within the substrate. In a desirable configuration, the SBAR piezoelectric film is substantially smaller than the actual airgap within the substrate. Electrodes in contact with the piezoelectric film permit excitation and detection of the acoustic resonance by the external electrical circuit.

To maintain the SBAR at a stable operating frequency over a wide range of ambient temperatures a heating ring is positioned around the perimeter of the piezoelectric film, and thus, the film is heated separately from the rest of the semiconductor substrate. Therefore, the piezoelectric film is maintained at a constant elevated temperature above the ambient temperature, and thus, a stable resonant frequency is maintained.

In order to enable the heating ring to maintain the piezoelectric film at a constant elevated temperature, a temperature sensing film is applied over the piezoelectric film. As the temperature of the piezoelectric film is sensed, a signal of the film's temperature is sent to an appropriate circuit applying a current to the heating element in order to adjust the temperature of the heating ring to maintain the temperature of the piezoelectric film constant. In this manner, the temperature of only the piezoelectric resonating film is controlled, and thus, much less heating is required than the prior art ovenized SBAR's.

Additional objects, advantages, and features of the present invention will become apparent from the following description and appended claims, taken in conjunction with the accompanying drawings

DETAILED DESCRIPTION OF THE PREFERRED EMBODIMENTS

The Following discussion of the preferred embodiments concerning a semiconductor bulk acoustic resonator is merely exemplary in nature and is in no way intended to limit the invention or its application or uses.

Figure 1:
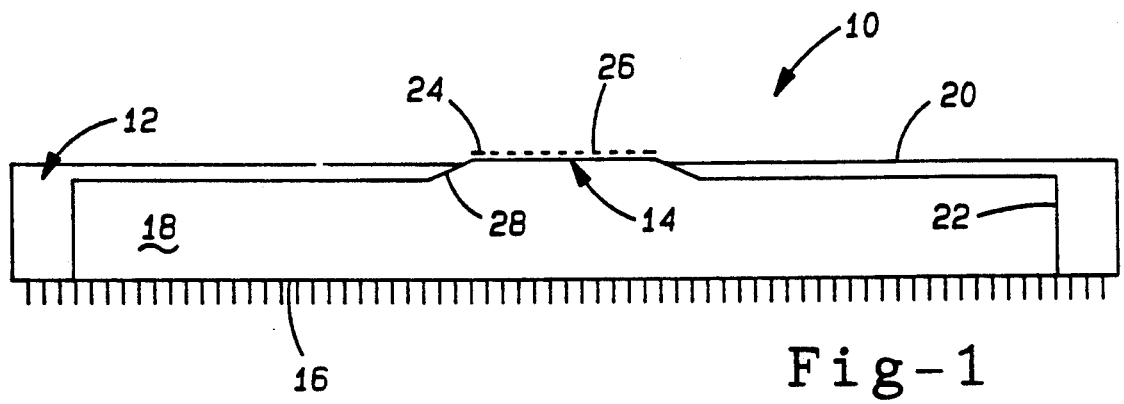
FIG. 1 is a cross section of an SBAR according to one preferred embodiment of the present invention.

First turning to FIG. 1, an SBAR assembly 10 is shown in a cross sectional view. The SBAR assembly 10 includes a semiconductor substrate 12 positioned on and adhered to an appropriate packaging floor 16, and an SBAR 14 positioned in a desirable configuration on the substrate 12. More particularly, the SBAR 14 is positioned at a central location above, and in contact with, an airgap 18 within the substrate 12, as shown. The Airgap 18 is defined as the volume enclosed by the packaging floor 16, an upper portion comprised of a thin semiconductor region 20, and side walls 22. Although the airgap 18 will generally be filled with air in most applications, it can be filled with other gases, and further can be a vacuum, as is known in the art.

According to one preferred embodiment, the substrate 12 is GaAs having a thickness of approximately 4 mils. The airgap 18 is formed within the substrate 12, generally by a etching process known to those skilled in the art, prior to the substrate 12 being adhered to the packaging floor 16. The etching process fabricates the thin region 20 to a thickness of approximately 0.5 mils. An opening 28 is then etched at a central location of the region 20 in order to accept the SBAR 14 such that the SBAR 14 is open to the atmosphere at one surface and open to the airgap 18 at an opposite surface.

The SBAR 14 includes a heating ring 24 and a sensing film 26. The heating ring 24 is positioned around an outer perimeter of the different layers which make up the SBAR 14 and can be any known electrical heating material, such as nickel chromium. The heating ring 24 is formed in this configuration to provide uniform heating to the SBAR 14, however, it is noted that the heating ring 24 depicted with a square perimeter (see FIG. 3) may take on other desirable shapes, such as a circular shape. The sensing film 26 is fabricated on a top surface of the layers which make up the SBAR 14 within the inner area defined by the heating ring 24. The sensing film 26 can be any sensing material which exhibits a desirable electrical resistance to temperature ratio. According to one preferred embodiment, the sensing film 26 is vanadium oxide and is approximately 4 m thick. As will be discussed in greater detail below, the heating ring 24 heats the SBAR 14 to an elevated temperature above ambient temperature, and the sensing film 26 senses this temperature in order to maintain it at a constant level.

Figure 2:
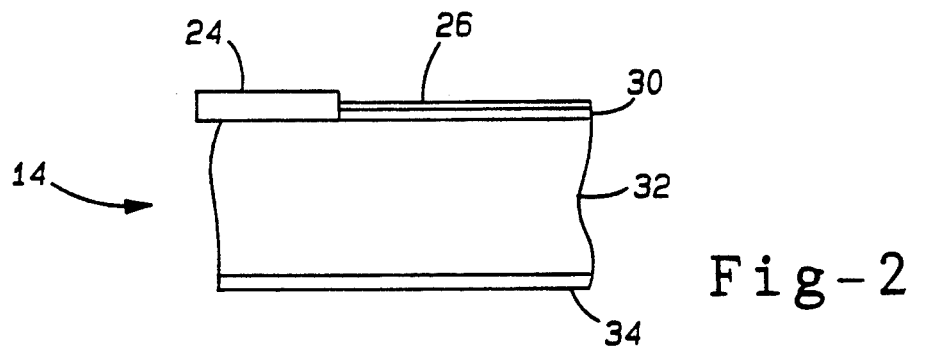
FIG. 2 is a blown up, partial cross section of the SBAR of FIG. 1.

Now turning to FIG. 2, the basic structure of the different layers which make up the SBAR 14 is shown. More particularly, the SBAR 14 includes a first electrode layer 30 on which the sensing film 26 is adhered to by an appropriate process such as sputtering or vapor deposition. The heating ring 24 is formed around the electrode layer 30 in order to provide a uniform temperature in its interior where the acoustic wave is resonating. Adhered to a bottom surface of the electrode layer 30, and comprising most of the thickness of the SBAR 14, is a piezoelectric layer 32. The piezoelectric layer 32 is typically several micrometers thick and acts to convert electrical energy into acoustical energy. Fabricated to a bottom surface of the piezoelectric layer 32, opposite the first electrode layer 30, is a second electrode layer 34. The first and second electrode layers 30 and 34 receive an electrical signal in order to apply the electrical signal to the piezoelectric layer 32.

According to one preferred embodiment, the first and second electrode layers 30 and 34 are aluminum fabricated to a thickness of approximately 1000 angstroms. Also, the piezoelectric layer 32 is aluminum nitride, however, other piezoelectric materials, such as zinc oxide, can be used in place of the aluminum nitride. It is noted that other resonator designs may incorporate more than one piezoelectric layer. One particular design includes an alternating configuration of more than one piezoelectric layers and more than two electrode layers. These types of designs are applicable to the heating method discussed above.

Figure 3:
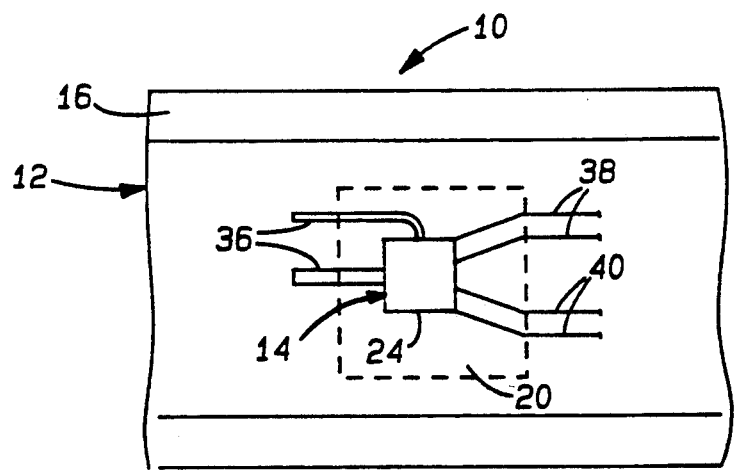
FIG. 3 is a top view of the SBAR of FIG. 1.

Now turning to FIG. 3, a top view of the SBAR assembly 10 is shown incorporating different conducting traces being applied to the SBAR 14. Once again, the assembly 10 includes a substrate 12 mounted on a package floor 16 where the SBAR 14 is configured in an appropriate manner over an airgap under a thin region 20. Two microstrip traces 36 from an oscillator circuit (not shown) are connected to the SBAR 14. One of the traces 36 will be connected to the first electrode layer 30 and the other trace 36 will be connected to the second electrode layer 34 for providing the input and output to drive the piezoelectric layer 32. In addition, two traces 38 are connected to the heating ring 24 surrounding the perimeter of the SBAR 14 in order to provide the necessary electrical current from a heating circuit (not shown) to the heating ring 24, and thus, raise the temperature of the SBAR 14. And further, two traces 40 from a sensing circuit (not shown) are appropriately connected to the sensing film 26 in order to provide a measurement of the change in current within the sensing film 26 upon the change in resistance due to the change in temperature. It is noted that the heating circuit and sensing circuit would normally be part of a control circuit which could be fabricated on the chip.

In operation, the oscillator circuit is intended to produce a constant frequency. Because the ambient temperature surrounding assembly 10 may fluctuate over a wide range, it would be very difficult to maintain this frequency constant over this temperature range. By applying an appropriate electrical current to the traces 38, it is possible through the heating ring 24 to increase the temperature of the SBAR 14 above a level which would be the highest ambient temperature expected. If the ambient temperature does change, affecting the temperature of the SBAR 14, the sensing film 26 will register this temperature change and indicate a rise or fall in temperature on the sensor traces 40. The sensing circuit will then provide the appropriate signal to the heating circuit in order to either raise or lower the temperature of the heating ring 24, thus maintaining the SBAR 14 at a constant temperature. In this regard, the temperature of the SBAR 14 will not significantly fluctuate, and thus the SBAR 14 will operate at a stable frequency.

By incorporating the airgap 18, the chip area around the SBAR 14 is thinned down and isolated from the package floor 16 such that the thermal resistance between the heating ring 24 and the package floor 16 is increased and the heating power required to heat the SBAR 14 is reduced. Consequently, it is possible to heat the SBAR 14 utilizing a minimal amount of power, and eliminating the need for the conventional ovens of the prior art.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined by the following claims.

What is claimed is:

1. A semiconductor bulk acoustic resonating device comprising:
   a semiconductor substrate;
   a piezoelectric device positioned on the substrate, said piezoelectric device including at least one electrode operable to receive an electrical signal such that when the electrode receives the electrical signal, the piezoelectric device converts the electrical energy into acoustical energy; and
   a heating device, said heating device being positioned adjacent to the piezoelectric device and being operable to heat the piezoelectric device.

2. The acoustic resonating device according to claim 1 further comprising a heat sensing device, said heat sensing device positioned relative to the piezoelectric device and being operable to sense the temperature of the piezoelectric device and generate a signal indicative of the temperature of the piezoelectric device.

3. The acoustic resonating device according to claim 2 wherein the heat sensing device is a film of vanadium dioxide.

4. The acoustic resonating device according to claim 1 wherein the heating device is a heating ring positioned around the perimeter of the piezoelectric device.

5. The acoustic resonating device according to claim 1 wherein the substrate includes a recess and wherein the piezoelectric device is positioned relative to and in contact with the recess.

6. The acoustic resonating device according to claim 1 wherein the piezoelectric device is comprised of a first electrode layer, a second electrode layer and a piezoelectric layer positioned between the first and second electrode layers, the first and second electrode layers being operable to receive the electrical signal.

7. The acoustic resonating device according to claim 1 wherein the heating device is a heating ring positioned around the perimeter of the piezoelectric device, and wherein the acoustic resonator further comprises a heat sensing film positioned within an inner circumference of the heating ring proximate to the piezoelectric device.

8. The acoustic resonating device according to claim 1 wherein the piezoelectric device is comprised of an alternating configuration of electrode layers and piezoelectric layers including at least three electrode layers and at least two piezoelectric layers.

9. A semiconductor bulk acoustic resonator comprising:
   a semiconductor substrate;
   a piezoelectric device positioned on the substrate, said piezoelectric device including at least one electrode operable to receive an electrical signal, wherein when the electrode receives the electrical signal, the piezoelectric device converts the electrical energy into acoustical energy at a predetermined frequency;
   a heating ring positioned around a perimeter of and in contact with the piezoelectric device, said heating ring operable to receive an electrical signal for heating the piezoelectric device to a substantially constant elevated temperature; and
   a heat sensing film positioned within an inner circumference of the heating ring proximate to the piezoelectric device, said heat sensing film operable to monitor the temperature of the piezoelectric device and provide a signal indicative of the temperature of the piezoelectric device.

10. The acoustic resonator of claim 9 wherein the substrate includes a recess wherein the piezoelectric device is positioned relative to the recess.

11. The acoustic resonator of claim 9 wherein the heat sensing film is vanadium dioxide.

12. The acoustic resonator of claim 9 wherein the piezoelectric device includes a piezoelectric layer positioned between a first electrode layer and a second electrode layer, the first and second electrode layers operable to receive the electrical signals for driving the piezoelectric layer.

13. The acoustic resonator of claim 9 wherein the piezoelectric device includes an alternating configuration of piezoelectric layers and electrode layers having at least two piezoelectric layers and three electrode layers.

* * * * *